United States Patent

Anderson et al.

[11] Patent Number: 6,118,175
[45] Date of Patent: Sep. 12, 2000

[54] WIRE BONDING SUPPORT STRUCTURE AND METHOD FOR COUPLING A SEMICONDUCTOR CHIP TO A LEADFRAME

[75] Inventors: Harold G. Anderson, Chandler; Albert John Laninga, Tempe; Rodney D. Purcell; Gilbert J. Archibeque, Jr., both of Mesa; Stefan M. Dykert, Phoenix, all of Ariz.

[73] Assignee: Motorola, Inc., Schaumburg, Ill.

[21] Appl. No.: 09/063,540

[22] Filed: Apr. 21, 1998

[51] Int. Cl.⁷ .......................... H01L 23/495; H01L 21/48; H01L 21/50
[52] U.S. Cl. .......................... 257/676; 438/117; 438/121; 438/123; 438/122; 438/617; 257/688
[58] Field of Search ..................................... 438/122, 121, 438/123, 117, 617; 257/676, 688; 29/25.01; 228/110.1, 212

[56] References Cited

U.S. PATENT DOCUMENTS 5,954,842   9/1999   Fogal et al. ............................ 29/25.01

*Primary Examiner*—C. Everhart
*Attorney, Agent, or Firm*—Anthony M. Martinez

[57] ABSTRACT

A flexible shelf (12) and a method for coupling a semiconductor chip (33) to a leadframe (23) using the flexible shelf (12). The flexible shelf (12) has a mounting portion (16), a flexible portion (17), and a leadframe support portion (18). The flexible shelf (12) is used in a wire bonding support assembly (10) to provide support for the leadframe (23) during wire bonding. The flexible portion (17) of the flexible shelf (12) flexes to increase thermal conductivity between a heater block (29) and the leadframe (23) during wire bonding.

20 Claims, 1 Drawing Sheet

WIRE BONDING SUPPORT STRUCTURE AND METHOD FOR COUPLING A SEMICONDUCTOR CHIP TO A LEADFRAME

FIELD OF THE INVENTION

The present invention relates, in general, to the manufacture of semiconductor components and, more particularly, to forming interconnects within the semiconductor components.

BACKGROUND OF THE INVENTION

A semiconductor component is typically comprised of a semiconductor chip mounted to a leadframe, where the semiconductor chip has a plurality of bond pads that are coupled to corresponding leadframe fingers. The semiconductor chip and the leadframe leads are surrounded by a protective material such as a mold compound.

An important step in the manufacture of semiconductor components is electrically coupling the bond pads on the semiconductor chip to corresponding leadframe leads. Typically, a leadframe is placed on a heater block of a wire bonder and a shelf is inserted between the leadframe and the heater block. The shelf prevents the leadframe leads from becoming deformed during the wire bonding process. However, the shelf may become misaligned such that it cannot be properly inserted between the leadframe leads and the heater block of the wire bonder. When a misalignment occurs, the wire bonder shuts down resulting in an increase in cycle time and production costs.

Accordingly, it would be advantageous to have a structure and a method for ensuring proper alignment of the shelf with the leadframe and the heater block of the wire bonder. It would be of further advantage for the structure and method to be readily integrable with wire bonders and to be cost efficient.

DETAILED DESCRIPTION OF THE DRAWINGS

Generally, the present invention provides a wire bonding support structure and a method for coupling a semiconductor chip to a leadframe using the wire bonding support structure. In accordance with the present invention, the wire bonding support structure, also referred to as a flexible shelf, has a flexible region or portion. The flexible region of the wire bonding support structure improves the ability to insert the wire bonding support structure between a heater block of a wire bonder and a leadframe.

Figure 1:
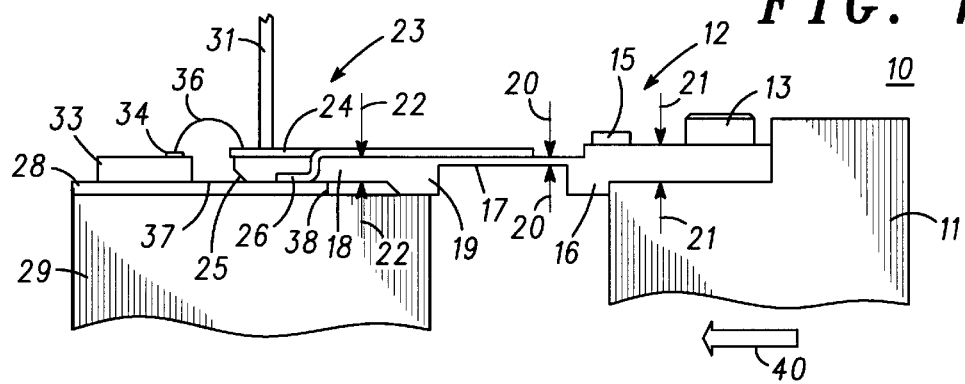
FIG. 1 is a side view of a wire bonding support assembly in accordance with one embodiment of the present invention.

FIG. 1 is a side view of a wire bonding support assembly 10 in accordance with one embodiment of the present invention. Support assembly 10 includes a flexible shelf 12 coupled to a mounting structure 11 by a fastener 13. Suitable materials for flexible shelf 12 include steel, steel alloys, spring steel, heat treated steels, or the like. Preferably, flexible shelf 12 is a unitary structure that has a mounting portion 16, a flexible portion 17 adjacent to mounting portion 16, and a leadframe support portion 18 adjacent to flexible portion 17. By way of example, flexible portion 17 has a thickness, indicated by arrows 20, ranging between approximately 0.13 millimeters (mm) and approximately 0.23 mm; mounting portion 16 has a thickness, indicated by arrows 21, ranging between approximately 3.68 mm and approximately 3.94 mm; and leadframe support portion 18 has a thickness, indicated by arrows 22, ranging between approximately 0.91 mm and approximately 0.98 mm. In one example, flexible portion 17, mounting portion 16, and leadframe support portion 18 each have a thickness of approximately 0.23, 3.68, and 0.98, respectively. Techniques for manufacturing flexible shelf 12 include machining, stamping, etching, and the like.

Further, mounting portion 16 has a leadframe stop or protrusion 15 and leadframe support portion 18 has a support protrusion 19 that contacts a heater block 29. A leadframe 23 having a leadfinger 24, a staking finger 26, and a heat sink 28 is adjacent to and contacts leadframe support portion 18. More particularly, leadfinger 24 contacts leadframe support portion 18 and staking finger 26 is attached to heat sink 28. Heat sink 28 has a surface 37 and an edge 38 and contacts heater block 29. It should be noted that heat sink 28 may be the flag or die pad portion of a leadframe. A semiconductor chip 33 having a wire bond pad 34 is mounted on heat sink 28. Wire bond pad 34 is coupled to leadfinger 24 by a wire bond 36.

In a beginning step of an embodiment of the present invention, flexible shelf 12 is flexibly inserted between leadfinger 24 and heat sink 28. Flexible shelf 12 is inserted between leadfinger 24 and heat sink 28 in a direction indicated by an arrow 40. When flexible shelf 12 is misaligned and leadframe support portion 18 contacts edge 38, then flexible portion 17 flexes and tapered ends 25 allow leadframe support portion 18 to slide along edge 38 and surface 37. This allows leadframe support portion 18 to insert between heat sink 28 and leadfinger 24. Leadframe stop 15 provides a means for limiting the distance flexible shelf 12 can be inserted between leadfinger 24 and heat sink 28. It should be understood that leadframe stop 15 is an optional feature, i.e., flexible shelf 12 can be manufactured without leadframe stop 15.

After leadframe support portion 18 is inserted between heat sink 28 and leadfinger 24, a clamp 31 contacts leadfinger 24 and applies a vertical load to leadfinger 24 forcing it to contact flexible shelf 12. In addition, clamp 31 forces flexible shelf 12 to contact heat sink 28. Flexible portion 17 flexes in the three axes of direction, i.e., axes x, y, and z (not shown), allowing leadframe support portion 18, heat sink 28, and leadfinger 24 to mate in a parallel fashion. In other words, leadframe support portion 18, heat sink 28, and leadfinger 24 are substantially parallel to each other when leadframe support portion 18 is mated to leadfinger 24 and heat sink 28. Mating leadfinger 24, leadframe support portion 18, and heat sink 28 in a parallel fashion prevents spaces or gaps between the areas where leadfinger 24 overlies leadframe support portion 18 and the areas where leadframe support portion 18 overlies heat sink 28. Gaps or spaces between leadfinger 24, leadframe support portion 18, and heat sink 28 reduce thermal conductivity and ultrasonic conductivity between these elements. Eliminating gaps between leadfinger 24, leadframe support portion 18, and heat sink 28 optimizes the transfer of thermal energy and ultrasonic energy between these elements during wire bonding, i.e., increases the thermal and ultrasonic conductivity between these elements.

A wire bonder (not shown) forms wire bond 36 by thermosonic bonding. One end of wire bond 36 is connected to wire bond pad 34 and the other end of wire bond 36 is connected to leadfinger 24. Since leadframe support portion 18, heat sink 28, and leadfinger 24 are mated in a parallel fashion, formation of wire bond 36 in accordance with the present invention is enhanced since the transfer of thermal energy and ultrasonic energy is optimized.

Figure 2:
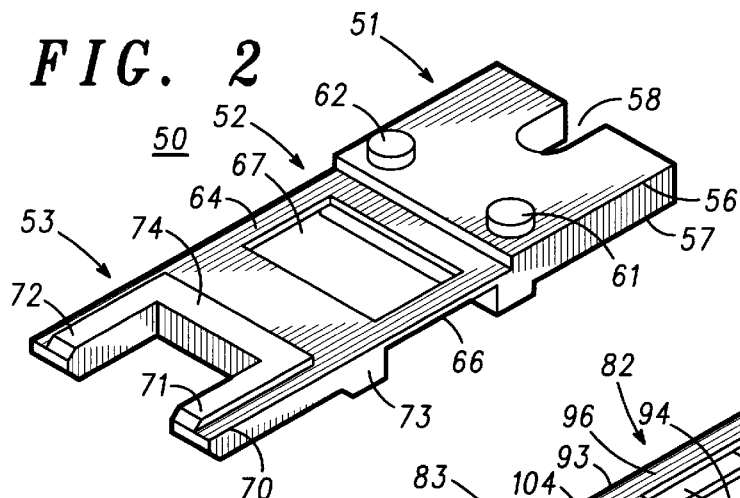
FIG. 2 is an isometric view of a flexible shelf in accordance with another embodiment of the present invention.

FIG. 2 is an isometric view of a flexible shelf 50 in accordance with another embodiment of the present invention. Flexible shelf 50 has a mounting portion 51, a flexible portion 52 adjacent to mounting portion 51, and a leadframe support portion 53 adjacent to flexible portion 52. Mounting portion 51 has a top surface 56, a bottom surface 57, and a notch 58 that extends from top surface 56 to bottom surface 57. Leadframe stops 61 and 62 are formed on top surface 56. Suitable materials for leadframe stops 61 and 62, mounting portion 51, flexible portion 52, and leadframe support portion 53 include, steel, steel alloys, spring steel, heat treated steels, or the like.

Flexible portion 52 has a top surface 64, a bottom surface 66, and an opening 67 that extends from top surface 64 to bottom surface 66. Leadframe support portion 53 has a top surface 70, two fingers 71 and 72, a support protrusion 73, and an elevated surface 74. Fingers 71 and 72 provide wire bonding support for leadframes having three-sided angular lead patterns such as, for example, leadframes for Single In-line Packages (SIPs) such as 15 or 23 lead SIPs. Elevated surface 74 is formed on top surface 70 and has a thickness ranging, for example, between approximately 0.13 mm and approximately 0.18 mm.

Like flexible shelf 12, flexible shelf 50 can be used in a wire bonding support assembly such as, for example, wire bonding support assembly 10 (FIG. 1). More particularly, flexible shelf 50 can be flexibly inserted between a leadfinger of a leadframe and a heat sink of the leadframe. Flexible portion 52 flexes when a vertical load is applied to leadframe support portion 53, i.e., a load in a direction that is substantially normal to surface 70. As a result of the added thickness of elevated surface 74, spaces between leadframe support portion 53 and a leadfinger contacting leadframe support portion 53 are eliminated. Opening 67 reduces the spring constant of flexible portion 52 and facilitates the ability of flexible portion 52 to flex in the three axes of direction, i.e., axes x, y, and z (not shown). Notch 58 provides a means for fastening mounting portion 51 to a mounting structure of a wire bonding support assembly.

Although flexible shelf 50 is shown as having leadframe stops 61 and 62 and elevated surface 74, these are not limitations of the present invention. Flexible shelf 50 can be manufactured without leadframe stops 61 and 62 and elevated surface 74.

Figure 3:
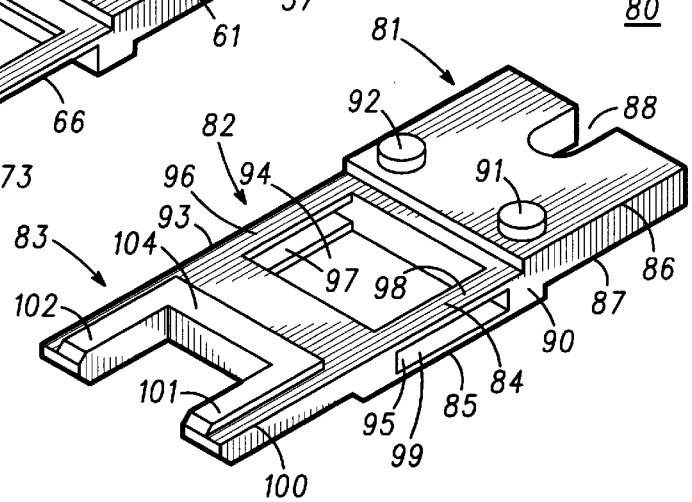
FIG. 3 is an isometric view of a flexible shelf in accordance with yet another embodiment of the present invention.

FIG. 3 is an isometric view of a flexible shelf 80 in accordance with yet another embodiment of the present invention. Flexible shelf 80 has a mounting portion 81, a flexible portion 82 adjacent to mounting portion 81, and a leadframe support portion 83 adjacent to flexible portion 82. Mounting portion 81 has a top surface 86, a bottom surface 87, and a notch 88 that extends from top surface 86 to bottom surface 87. Leadframe stops 91 and 92 are formed on top surface 86. Suitable materials for leadframe stops 91 and 92, mounting portion 81, flexible portion 82, and leadframe support portion 83 include, steel, steel alloys, spring steel, heat treated steels, or the like.

Flexible portion 82 has a top surface 84, a bottom surface 85, side surfaces 90 and 93, and four flexible supports 96, 97, 98, and 99. Flexible supports 96, 97, 98, and 99 are formed by machining flexible portion 82 to form an opening 94 through surfaces 84 and 85 and an opening 95 through surfaces 90 and 93. Opening 94 extends from top surface 84 to bottom surface 85 and is spaced apart from side surfaces 90 and 93. Opening 95 extends from side surface 90 to side surface 93 and is spaced apart from surfaces 84 and 85.

Leadframe support portion 83 has a top surface 100, two fingers 101 and 102, and an elevated surface 104 extending from top surface 100.

Like flexible shelf 12, flexible shelf 80 can be used in a wire bonding support assembly such as, for example, wire bonding support assembly 10 (FIG. 1). More particularly, flexible shelf 80 can be flexibly inserted between a leadfinger of a leadframe and a heat sink of the leadframe. Flexible supports 96, 97, 98, and 99 flex when a vertical load, i.e., a load substantially normal to surface 100, is applied to leadframe support portion 83. Notch 88 provides a means for fastening mounting portion 81 to a mounting structure of a wire bonding support assembly. Fingers 101 and 102 provide wire bonding support for leadframes having three-sided angular lead patterns such as, for example, leadframes for 23-lead SIPs or 15-lead SIPs.

Figure 4:
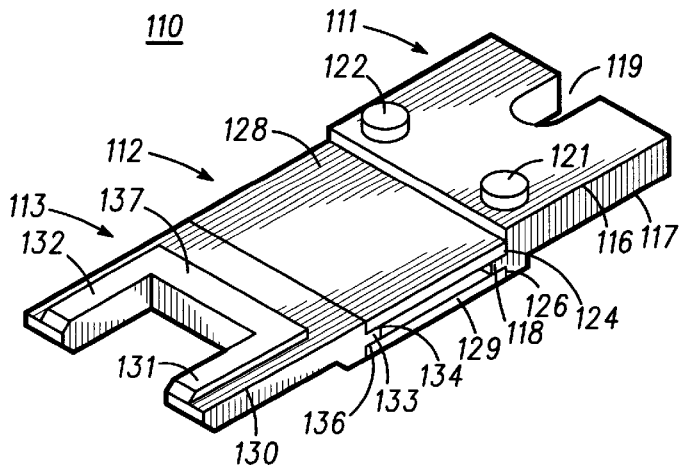
FIG. 4 is an isometric view of a flexible shelf in accordance with yet another embodiment of the present invention.

FIG. 4 is an isometric view of a flexible shelf 110 in accordance with yet another embodiment of the present invention. Flexible shelf 110 has a mounting portion 111, a flexible portion 112 coupled to mounting portion 111, and a leadframe support portion 113 coupled to flexible portion 112. Mounting portion 111 has a top surface 116, a bottom surface 117, a mounting protrusion 118, and a notch 119 that extends from top surface 116 to bottom surface 117. Leadframe stops 121 and 122 are formed on top surface 116. Mounting protrusion 118 has a top mounting surface 124 and a bottom mounting surface 126.

Flexible sections 128 and 129 cooperate with mounting portion 111 and leadframe support portion 113 to form flexible portion 112. A portion of flexible section 128 is coupled to top mounting surface 124 and a portion of flexible section 129 is coupled to bottom mounting surface 126. Techniques for coupling flexible sections 128 and 129 to mounting surfaces 124 and 126, respectively, include riveting, soldering, fastening, or the like. Suitable materials for leadframe stops 121 and 122, mounting portion 111, leadframe support portion 113, and flexible sections 128 and 129 include, steel, steel alloys, spring steel, heat treated steels, or the like.

Leadframe support portion 113 has a top surface 130, two fingers 131 and 132, a mounting protrusion 133, and an elevated surface 137 extending from top surface 130. Mounting protrusion 133 has a top mounting surface 134 and a bottom mounting surface 136. A portion of flexible section 128 is coupled to top mounting surface 134 and a portion of flexible section 129 is coupled to bottom mounting surface 136 using the same or similar technique used to couple flexible sections 128 and 129 to mounting surfaces 124 and 126, respectively.

Like flexible shelf 12, flexible shelf 110 can be used in a wire bonding support assembly such as, for example, wire bonding support assembly 10 (FIG. 1). More particularly, flexible shelf 110 can be flexibly inserted between a leadfinger of a leadframe and a heat sink of the leadframe. Flexible sections 128 and 129 flex when a vertical load, i.e., a load substantially normal to surface 130, is applied to leadframe support portion 113. Notch 119 provides a means for fastening mounting portion 111 to a mounting structure of a wire bonding support assembly. Fingers 131 and 132 provide wire bonding support for leadframes having three-sided angular lead patterns such as, for example, leadframes for 23-lead SIPs or 15-lead SIPs.

By now it should be appreciated that a wire bonding support structure and a method for coupling a semiconductor chip to a leadframe using the wire bonding support structure have been provided. An advantage of the present invention is that the wire bonding support structure has a flexible portion that can be flexibly inserted into a wire bonding support assembly. Another advantage of the present invention is that it allows for mating in a parallel fashion which results in increased transfer of thermal energy and ultrasonic energy during wire bonding. Further, the present invention is compatible with standard wire bonding support assemblies.

What is claimed is:

1. A wire bonding support structure, comprising:
    a mounting portion having a first surface and a second surface;
    a flexible portion coupled to the mounting portion, wherein the flexible portion includes a first flexible support and a second flexible support; and
    a leadframe support portion having a surface, wherein the leadframe support portion is coupled to the flexible portion and the first and second flexible supports extend from the mounting portion to the leadframe support portion.

2. The wire bonding support structure of claim 1, wherein the wire bonding support structure is a unitary structure.

3. The wire bonding support structure of claim 1, further comprising a leadframe stop formed on the first surface of the mounting portion.

4. The wire bonding support structure of claim 1, wherein the mounting portion further includes a notch that extends from the first surface to the second surface.

5. The wire bonding support structure of claim 1, wherein the mounting portion further includes a mounting protrusion and the leadframe support portion further includes a mounting protrusion.

6. The wire bonding support structure of claim 1, further including an elevated surface extending from the surface of the leadframe support portion.

7. The wire bonding support structure of claim 1, wherein the first and second flexible supports are separated by an opening that extends from a first surface of the flexible portion to a second surface of the flexible portion.

8. The wire bonding support structure of claim 1, wherein the flexible portion further includes:
    a third flexible support extending from the mounting portion to the leadframe portion; and
    a fourth flexible support extending from the mounting portion to the leadframe portion.

9. The wire bonding support structure of claim 1, wherein the leadframe support portion has two fingers.

10. A wire bonding support assembly, comprising:
    a flexible shelf having a mounting portion, a flexible portion coupled to the mounting portion of the flexible shelf, and a leadframe support portion coupled to the flexible portion of the flexible shelf;
    wherein the flexible portion is between the mounting portion and the leadframe support portion; and
    wherein the flexible portion has an opening extending from a first surface of the flexible portion to a second surface of the flexible portion.

11. The wire bonding support assembly of claim 10, wherein the flexible shelf is a unitary structure.

12. The wire bonding support assembly of claim 10, wherein the flexible portion of the flexible shelf includes:
    a first flexible support having a first portion coupled to the mounting portion of the flexible shelf and a second portion coupled to the leadframe support portion of the flexible shelf; and
    a second flexible support having a first portion coupled to the mounting portion of the flexible shelf and a second portion coupled to the leadframe support portion of the flexible shelf, wherein the first and second flexible supports are separated by the opening.

13. The wire bonding support assembly of claim 10, wherein a thickness of the flexible portion is less than a thickness of the leadframe support portion.

14. The wire bonding support assembly of claim 10, further including:
    a mounting structure coupled to the flexible shelf; and
    a heater block adjacent to the leadframe support portion of the flexible shelf.

15. The wire bonding support assembly of claim 14, further including a leadframe having a leadfinger adjacent to the leadframe support portion of the flexible shelf, a heat sink adjacent to the heater block, and a staking finger coupled to the heat sink of the leadframe.

16. A method for electrically coupling a semiconductor chip to a leadframe having a heat sink and at least one leadfinger, comprising the steps of:
    inserting a flexible support structure between the heat sink and the at least one leadfinger; and
    wire bonding the semiconductor chip to the leadframe.

17. The method of claim 16, further including the step of placing the at least one leadfinger in contact with the support structure by applying a vertical load to the at least one leadfinger.

18. The method of claim 16, further including the step of mating the heat sink, the support structure, and the at least one leadfinger in a parallel fashion.

19. The method of claim 16, wherein the step of inserting a flexible support structure between the heat sink and the at least one leadfinger includes using a flexible support structure having a mounting portion, a flexible portion adjacent to the mounting portion, and a leadframe support portion adjacent to the flexible portion, wherein the flexible portion includes first and second flexible supports that extend from the mounting portion to the leadframe support portion.

20. The method of claim 19, wherein the step of wire bonding the semiconductor chip to the leadframe includes flexing the flexible portion of the support structure so that the at least one leadfinger, the leadframe support portion, and the heat sink are substantially parallel.

* * * * *